United States Patent
Chen et al.

(10) Patent No.: US 9,812,212 B2
(45) Date of Patent: Nov. 7, 2017

(54) MEMORY CELL WITH LOW READING VOLTAGES

(71) Applicant: eMemory Technology Inc., Hsin-Chu (TW)

(72) Inventors: Hsueh-Wei Chen, Hsinchu (TW); Wei-Ren Chen, Pingtung County (TW); Wein-Town Sun, Taoyuan (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/408,434

(22) Filed: Jan. 18, 2017

(65) Prior Publication Data

US 2017/0206975 A1    Jul. 20, 2017

Related U.S. Application Data

(60) Provisional application No. 62/280,683, filed on Jan. 19, 2016.

(51) Int. Cl.
  *G11C 16/04* (2006.01)
  *G11C 16/26* (2006.01)
  *G11C 16/14* (2006.01)
  *H01L 27/11519* (2017.01)

(52) U.S. Cl.
  CPC .......... *G11C 16/26* (2013.01); *G11C 16/0408* (2013.01); *G11C 16/14* (2013.01); *H01L 27/11519* (2013.01)

(58) Field of Classification Search
  CPC . G11C 16/0441; G11C 16/0433; G11C 16/26; G11C 16/10; G11C 16/08; G11C 16/0408; G11C 16/14; G11C 2216/10; G11C 16/0458; G11C 11/5628; G11C 16/0416; G11C 16/045; G11C 16/0475
  USPC .............. 365/185.18, 185.05, 185.1, 185.28, 365/185.29, 185.01, 185.14, 185.17, 365/185.02, 185.23, 185.26, 185.33
  See application file for complete search history.

(56) References Cited

U.S. PATENT DOCUMENTS

| | | | | |
|---|---|---|---|---|
| 5,959,889 A | * | 9/1999 | Ratnakumar | G11C 16/26 365/185.01 |
| 6,992,927 B1 | | 1/2006 | Poplevine | |
| 9,425,204 B2 | | 8/2016 | Ching | |

* cited by examiner

*Primary Examiner* — Thong Q Le
(74) *Attorney, Agent, or Firm* — Winston Hsu

(57) ABSTRACT

A memory cell includes a program select transistor, a program element, a read select transistor, a read element, and an erase element. The program select transistor is coupled to a program source line, a program select line, and a program control line. The program element is coupled to the second terminal of the program select transistor, a program bit line, and the program control line. The read select transistor is coupled to a read source line, a read select line, and a bias control line. The read element is coupled to the second terminal of the read select transistor, a read bit line, and the bias control line. The erase element is coupled to an erase control line. A floating gate is coupled to the erase element, the program element and the read element.

20 Claims, 6 Drawing Sheets

MEMORY CELL WITH LOW READING VOLTAGES

CROSS REFERENCE TO RELATED APPLICATIONS

This non-provisional application claims priority of U.S. provisional application No. 62/280,683, filed on Jan. 19, 2016, included herein by reference in its entirety.

BACKGROUND OF THE INVENTION

1. Field of the Invention

This invention is related to a memory cell, especially to a memory cell with high endurance for multiple program operations.

2. Description of the Prior Art

Non-volatile memory (NVM) is a type of memory that retains information it stores even when no power is supplied to memory blocks thereof.

Due to the wide range of applications for various uses, there is a growing need for a nonvolatile memory to be embedded in the same chip with the main circuit, especially for personal electronic devices having strict requirements for circuit area.

According to the programming times limit, non-volatile memory devices are divided into multi-time programmable (MTP) memory and one-time programmable (OTP) memory. A MTP nonvolatile memory cell of prior art includes one floating gate transistor for retaining data, and one or two select transistors for enabling the floating gate transistor to perform corresponding read, program and erase operations. To program or erase the memory cell by electron injection or electron tunneling, high voltages must be applied to the floating gate. In prior art, since the select transistors are connected to the floating gate transistor directly for controlling the operations, the select transistors need be formed by a high voltage process. However, in a high voltage process, the select transistors require greater area which is against the trend of reducing chip area. Also, the high turned-on voltage required by the select transistors extends the time for a read operation, lowering the reading speed.

SUMMARY OF THE INVENTION

One embodiment of the present invention discloses a memory cell. The memory cell includes a program select transistor, a program element, a read select transistor, a read element, and an erase element.

The program select transistor has a first terminal coupled to a program source line, a second terminal, a control terminal coupled to a program select line, and a body terminal coupled to a program control line. The program element has a first terminal coupled to the second terminal of the program select transistor, a second terminal coupled to a program bit line, and a body terminal coupled to the program control line. The read select transistor has a first terminal coupled to a read source line, a second terminal, a control terminal coupled to a read select line, and a body terminal coupled to a bias control line. The read element has a first terminal coupled to the second terminal of the read select transistor, a second terminal coupled to a read bit line, and a body terminal coupled to the bias control line. A common floating gate is coupled to the program element and the read element. The erase element has a first terminal coupled to an erase control line, and a second terminal coupled to the common floating gate.

The thickness of the gate oxide of the read select transistor is smaller than the thickness of the gate oxide of the program select transistor.

Another embodiment of the present invention disclose a memory array. The memory array includes a plurality of program bit lines, a plurality of program select lines, a plurality of program control lines, a plurality of erase control lines, a plurality of program source lines, a plurality of read bit lines, a plurality of read select lines, a plurality of bias control lines, a plurality of read source lines, and a plurality of rows of memory cells.

Each of the memory cells includes a program select transistor, a program element, a read select transistor, a read element, and an erase element.

The program select transistor has a first terminal coupled to a corresponding program source line, a second terminal, a control terminal coupled to a corresponding program select line, and a body terminal coupled to a corresponding program control line. The program element has a first terminal coupled to the second terminal of the program select transistor, a second terminal coupled to a corresponding program bit line, and a body terminal coupled to the program control line. The read select transistor has a first terminal coupled to a corresponding read source line, a second terminal, a control terminal coupled to a corresponding read select line, and a body terminal coupled to a corresponding bias control line. The read element has a first terminal coupled to the second terminal of the read select transistor, a second terminal coupled to a corresponding read bit line, and a body terminal coupled to the bias control line. A common floating gate is coupled to the program element and the read element. The erase element has a first terminal coupled to a corresponding erase control line, and a second terminal coupled to the common floating gate.

The thickness of the gate oxide of the read select transistor is smaller than the thickness of the gate oxide of the program select transistor.

Also, memory cells in the same row are coupled to the same program select line, the same read select line, the same bias control line, and the same erase control line. Memory cells in the same column are coupled to the same read bit line, the same read source line, the same program bit line, the same program source line, and the same program control line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
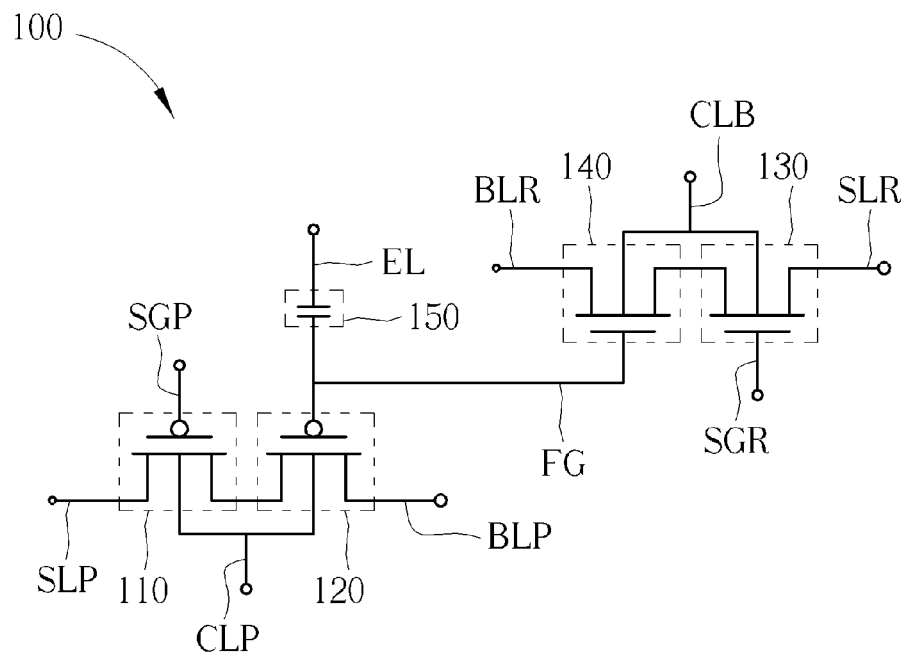
FIG. 1 shows a memory cell according to one embodiment of the present invention.

FIG. 1 shows a memory cell 100 according to one embodiment of the present invention. The memory cell 100 includes a program select transistor 110, a program element 120, read select transistor 130, a read element 140, an erase element 150, and a common floating gate FG.

The program select transistor 110 has a first terminal coupled to a program source line SLP, a second terminal, a control terminal coupled to a program select line SGP, and a body terminal coupled to a program control line CLP.

The program element 120 has a first terminal coupled to the second terminal of the program select transistor 110, a second terminal coupled to a program bit line BLP, and a body terminal coupled to the program control line CLP.

The read select transistor 130 has a first terminal coupled to a read source line SLR, a second terminal, a control terminal coupled to a read select line SGR, and a body terminal coupled to a bias control line CLB;

The read element 140 has a first terminal coupled to the second terminal of the read select transistor 130, a second terminal coupled to a read bit line BLR, and a body terminal coupled to the bias control line CLB.

The erase element 150 has a first terminal coupled to an erase control line EL, and a second terminal coupled to the common floating gate FG. coupled to the program element 120 and the read element 140.

Moreover, the second terminal of the erase element 150, the control terminal of the program element 120 and the control terminal of the read element 140 are coupled to the common floating gate FG.

In this case, the memory cell 100 is selected to perform the program and erase operations mainly by the program select transistor 110, and is selected to perform the read operation mainly by the read select transistor 130. That is, the high voltages required during the program or erase operation will not be applied to the read select transistor 130 directly. Therefore, the read select transistor 130 can be manufactured by a low voltage process while the program select transistor 110, the program element 120, the erase element 150 and the read element 140 can be manufactured by a high voltage process.

For example, the thickness of the gate oxide of the read select transistor 130 can be smaller than the thickness of the gate oxide of the program select transistor 110, and the gate oxides of the program select transistor 110, the program element 120, the erase element 150 and the read element 140 can have the same thickness. Consequently, the program select transistor 110, the program element 120, the erase element 150 and the read element 140 can endure high voltages required by the program and erase operations, such as 7V or higher, while the read select transistor 110 can perform the read operation with low voltages, such as 1.5V or lower.

Figure 2:
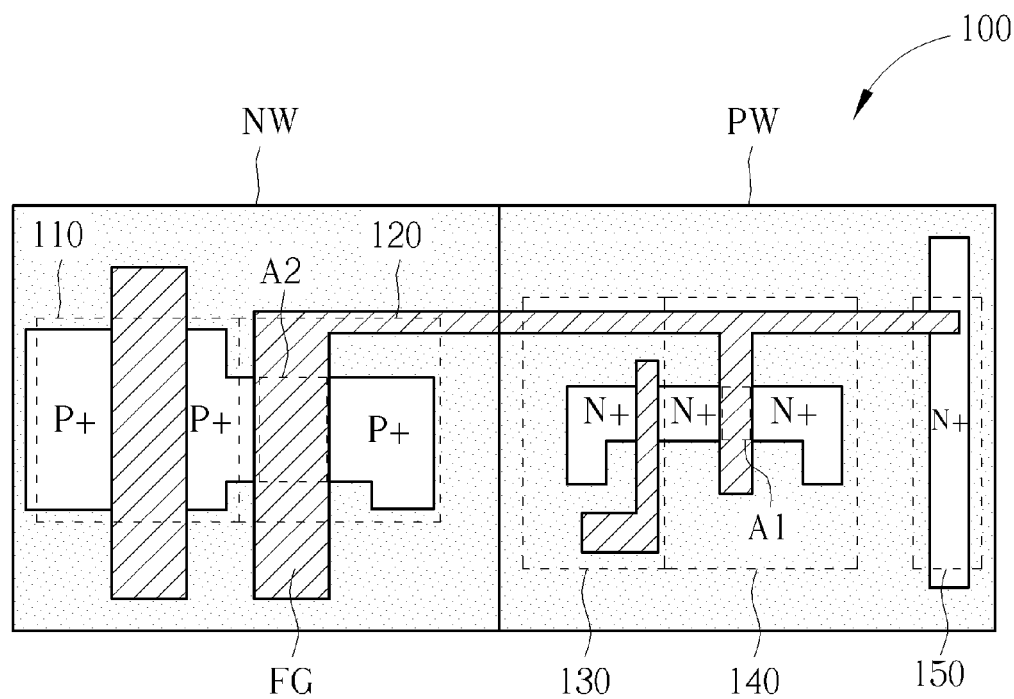
FIG. 2 shows the layout of the memory cell in FIG. 1 according to one embodiment of the present invention.

FIG. 2 shows the layout of the memory cell 100 according to one embodiment of the present invention. In FIG. 2, the program select transistor 110 and the program element 120 can be formed by P-type metal-oxide-semiconductors (PMOS) while the read select transistor 130, the read element 140, and the erase element 150 can be formed by N-type metal-oxide-semiconductors (NMOS).

The program select transistor 110 and the program element 120 are formed with the P-type dope regions P+ in the same N-well NW. In this case, the body terminals of the program select transistor 110 and the program element 120 can be the N-well NW. Also, the read select transistor 130, the read element 140, and the erase element 150 are formed with the N-type doped regions N+ disposed in the same P-well PW. The body terminals of the read select transistor 130 and the read element 140 can be the P-well PW. However, the first terminal of the erase element 150 can be the N-type doped region N+ disposed in the P-well PW so that the voltage applied to the erase control line EL will not affect the read select transistor 130 and the read element 140. The erase element 150 may further has a body terminal which can be the P-well PW. The body terminals of the erase element 150, the read select transistor 130, and the read element 140 are all connected together via the P-well PW.

In addition, the area A1 on an active region of the read element 140 overlapping with the common floating gate FG is smaller than the area A2 on an active region of the program element 120 overlapping with the common floating gate FG as shown in FIG.2. Therefore, the voltage of the common floating gate FG can be dominated by the program element 120.

Also, since the read select transistor 130 is formed by the low voltage process, the read select transistor 130 can be disposed nonadjacent to the erase element 150, preventing the read select transistor 130 from being damaged by the high voltage applied to the erase element 150.

Figure 3:
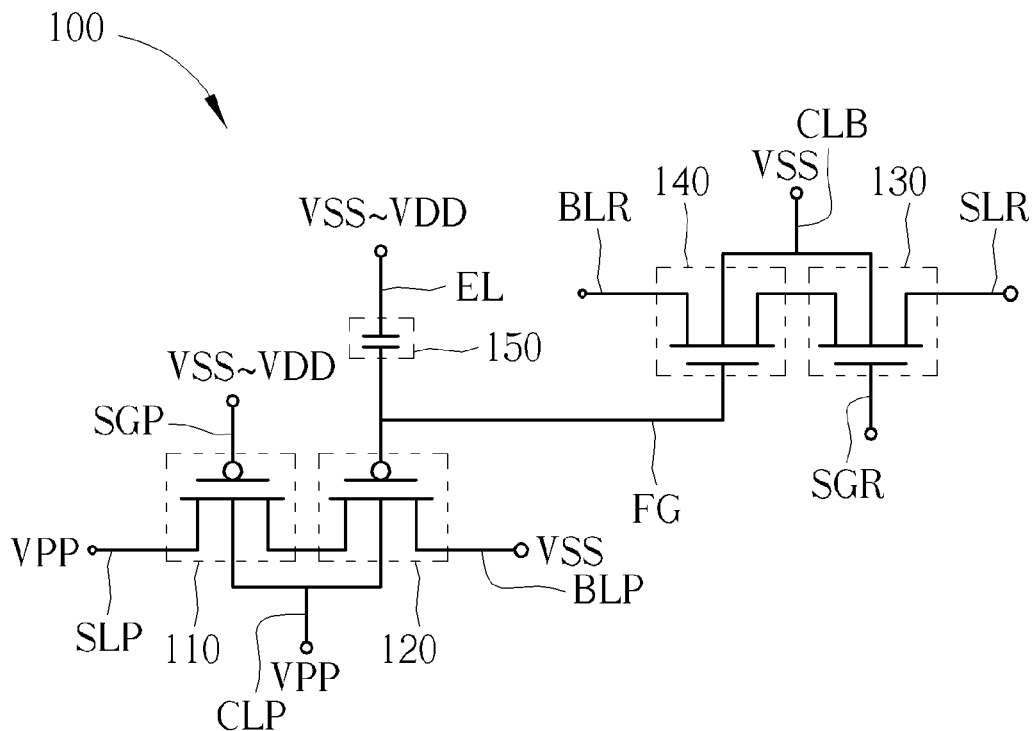
FIG. 3 shows the voltages applied to the control lines of the memory cell in FIG. 1 during the program operation.

FIG. 3 shows the voltages applied to the control lines of the memory cell 100 during the program operation of the memory cell 100. During the program operation of the memory cell 100, the program source line SLP, the program control line CLP are at a first voltage VPP, the program select line SGP and the erase control line EL are in a voltage range between a second voltage VDD and a third voltage VSS, and the program bit line BLP and the bias control line CLB are at the third voltage VSS. The read source line SLR, the read select line SGR, and the read bit line BLR are floating. The first voltage VPP is greater than the second voltage VDD, and the second voltage VDD is greater than the third voltage VSS. For example, the first voltage VPP can be 7.5V, the second voltage VDD can be 5V, and the first voltage VSS can be the ground voltage, that is 0V.

In this case, the body terminal of the program element 120 receives the first voltage VPP through the program control line CLP and the program select transistor 110 is turned on by the low voltage provided by the program select line SGP. Therefore, the high voltage coupled to the common floating gate FG can cause the channel hot electron injection. Consequently, the electrons will be trapped by the program element 120 and the memory cell 100 can be programmed.

Also, since the read source line SLR, the read select line SGR, and the read bit line BLR are floating during the program operation, the program operation will not induce any currents on the read select transistor 130 and the read element 140.

Figure 4:
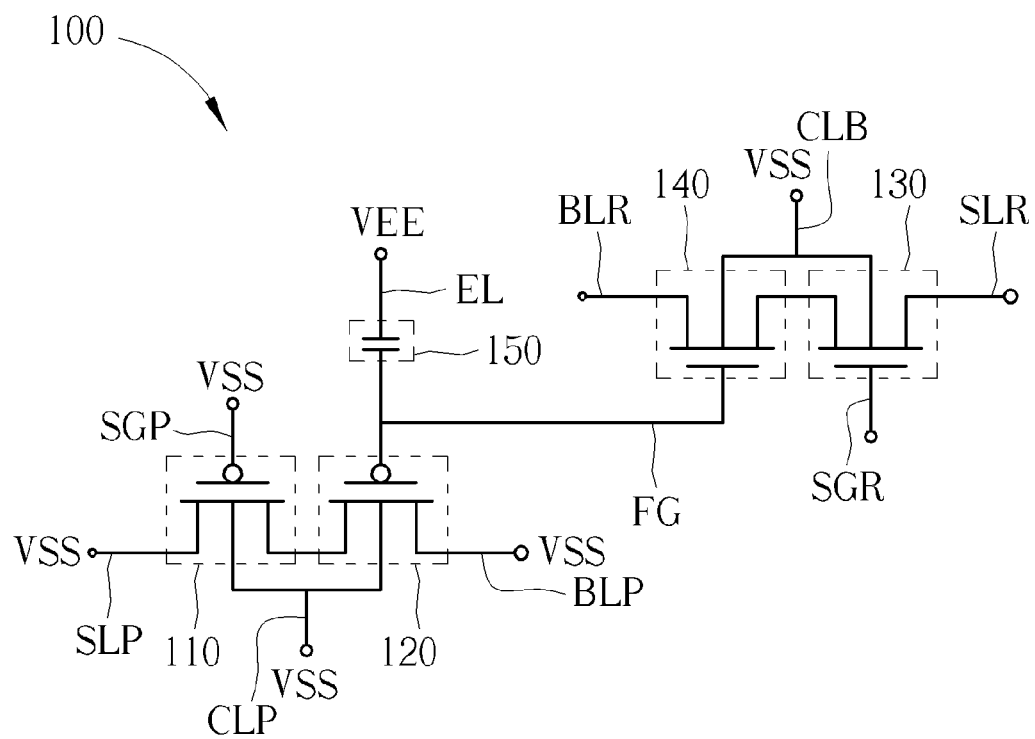
FIG. 4 shows the voltages applied to the control lines of the memory cell in FIG. 1 during the erase operation.

FIG. 4 shows the voltages applied to the control lines of the memory cell 100 during the erase operation of the memory cell 100. During the erase operation of the memory cell 100, the program source line SLP, the program select line SGP, the program bit line BLP, and the program control line CLP are at the third voltage VSS, and the erase control line EL is at a fourth voltage VEE greater than the first voltage VPP. In some embodiments, the first voltage VPP can be 7.5V while the fourth voltage VEE can be 15V. Also, the bias control line CLB is at the third voltage VSS, the read source line SLR, the read select line SGR, and the read bit line BLR are floating.

In this case, the body terminal of the program element 120 receives the third voltage VSS through the program control line CLP and the program select transistor 110 is turned off. Also, the common floating gate FG is coupled to a high voltage by the erase element 150 through the erase control line EL. Since the erase control line EL is at the fourth voltage VEE, which is even greater than the first voltage VPP, the high voltage difference between the common floating gate FG and the erase control line EL can cause Fowler-Nordheim tunneling. Therefore, the electrons trapped in the common floating gate FG of the program element 120 previously will be ejected, and the memory cell 100 can be erased.

Also, since the read source line SLR, the read select line SGR, and the read bit line BLR are floating during the erase operation, the erase operation will not induce any currents on the read select transistor 130 and the read element 110.

Figure 5:
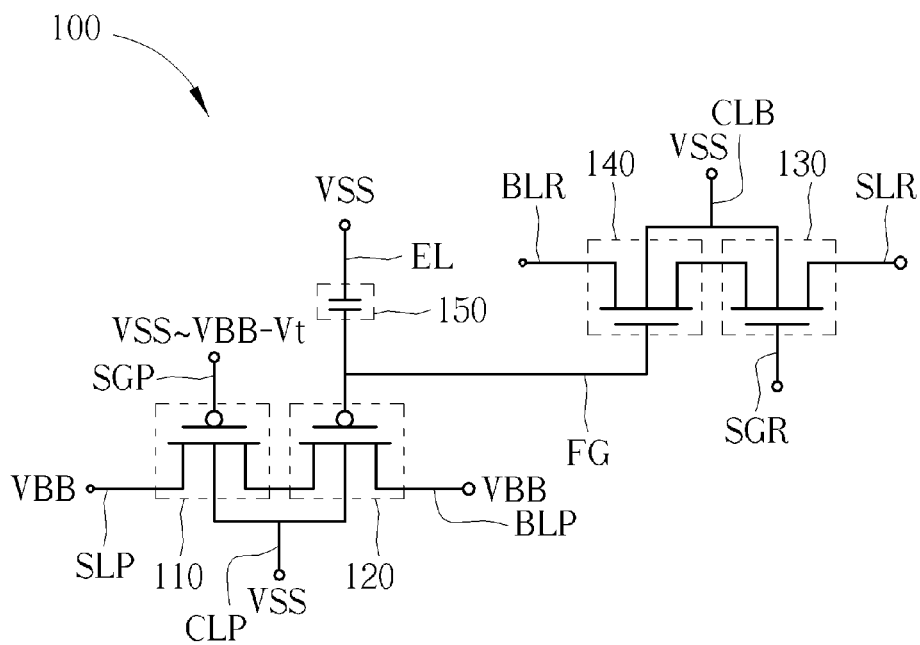
FIG. 5 shows the voltages applied to the control lines of the memory cell in FIG. 1 during the negative erase operation.

In some embodiments, the erase operation can be performed by negative voltages. FIG. 5 shows the voltages applied to the control lines of the memory cell 100 during the negative erase operation of the memory cell 100. During the negative erase operation of the memory cell 100, the program source line SLP, and the program bit line BLP are at a fifth voltage VBB, the program select line SGP is in a voltage range between the fifth voltage VBB less a threshold voltage Vt of the program select transistor 110 and a third voltage VSS, and the program control line CLP, the erase control line EL, and the bias control line CLB are at the third voltage VSS. The third voltage VSS is greater than the fifth voltage VBB. That is, the fifth voltage VBB can be a negative voltage, such as −15V, while the third voltage VSS can be the ground voltage.

Also, the bias control line CLB is at the third voltage VSS, the read source line SLR, the read select line SGR, and the read bit line BLR are floating.

Figure 6:
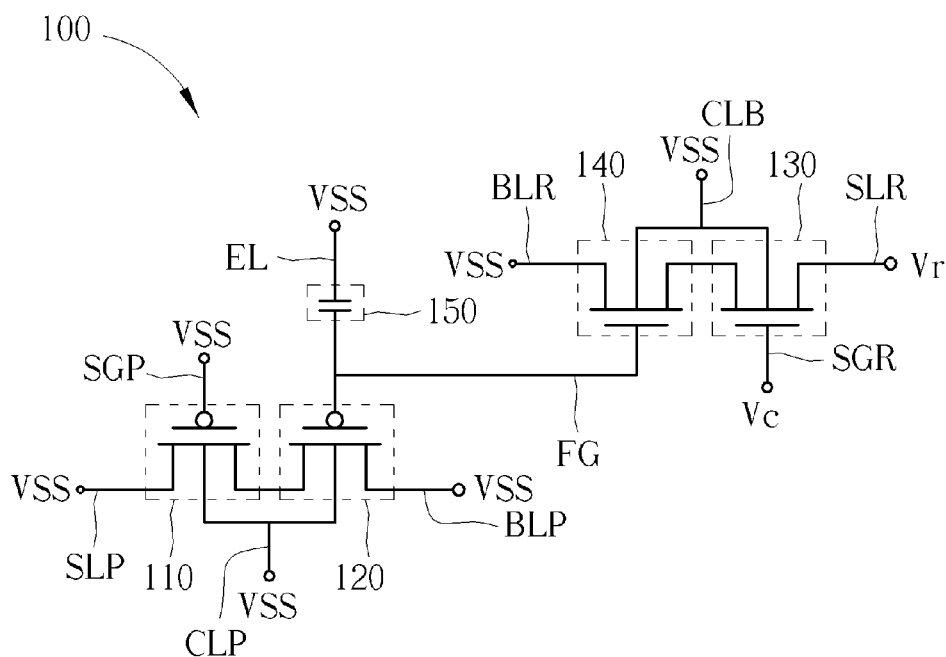
FIG. 6 shows the voltages applied to the control lines of the memory cell in FIG. 1 during the read operation.

FIG. 6 shows the voltages applied to the control lines of the memory cell 100 during the read operation of the memory cell 100. During the read operation of the memory cell 100, the program source line SLP, the program select line SGP, the program bit line BLP, the program control line CLP, the erase control line EL, and the bias control line CLB are at the third voltage VSS. Also, the read source line SGR is at a sixth voltage Vr, the read select line SGR is at a seventh voltage Vc, and the read bit line BLR is at the third voltage VSS. The seventh voltage Vc is greater than or equal to the sixth voltage Vr, and the sixth voltage Vr is greater than the third voltage VSS. For example, the seventh voltage Vc can be 1.2V to 1.5V while the sixth voltage Vr can be 1.2V.

In this case, the read select transistor 130 can be turned on, and the reading current may be generated according to the status of the common floating gate FG. For example, if the memory cell 100 is programmed, the electrons would be trapped in the by the program element 120. Therefore, the common floating gate FG would be at a rather high voltage so the reading current would be generated and output through the read bit line BLR. On the contrary, if the memory cell 100 has not been programmed previously, or was programmed previously but has been erased afterwards, then no reading current will be generated. Therefore, the information stored in the memory cell 100 can be identified according to the intensity of the reading current.

Also, since the read element 140 and the read select transistor 130 are formed by NMOS, the reading current generated by the memory cell 100 can be greater than the reading current generated by the memory cells with PMOS transistors due to the intrinsic characteristic of NMOS. Therefore, the reading speed of the memory cell 100 can also be increased.

Figure 7:
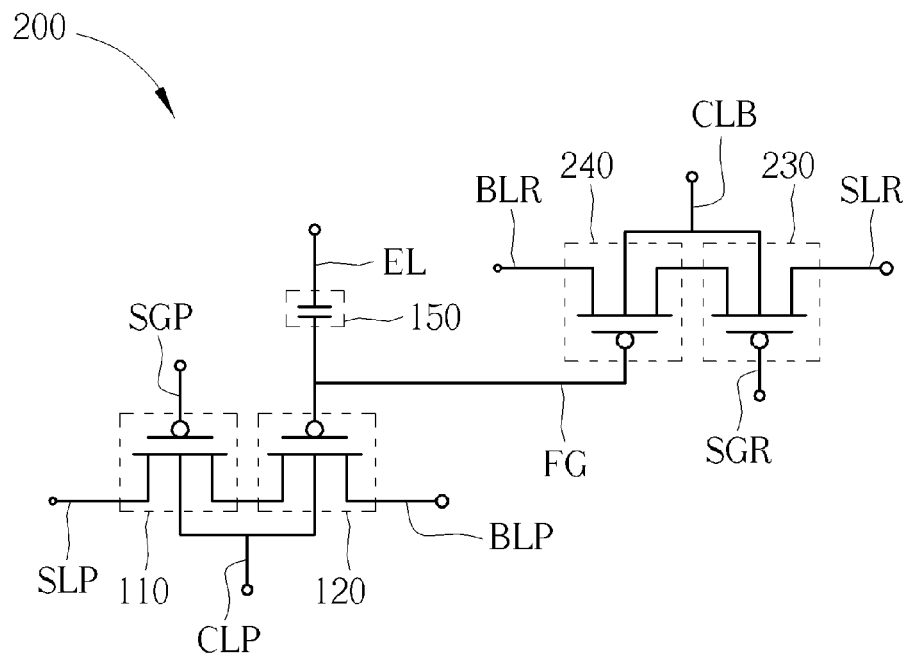
FIG. 7 shows a memory cell according to another embodiment of the present invention.
Figure 8:
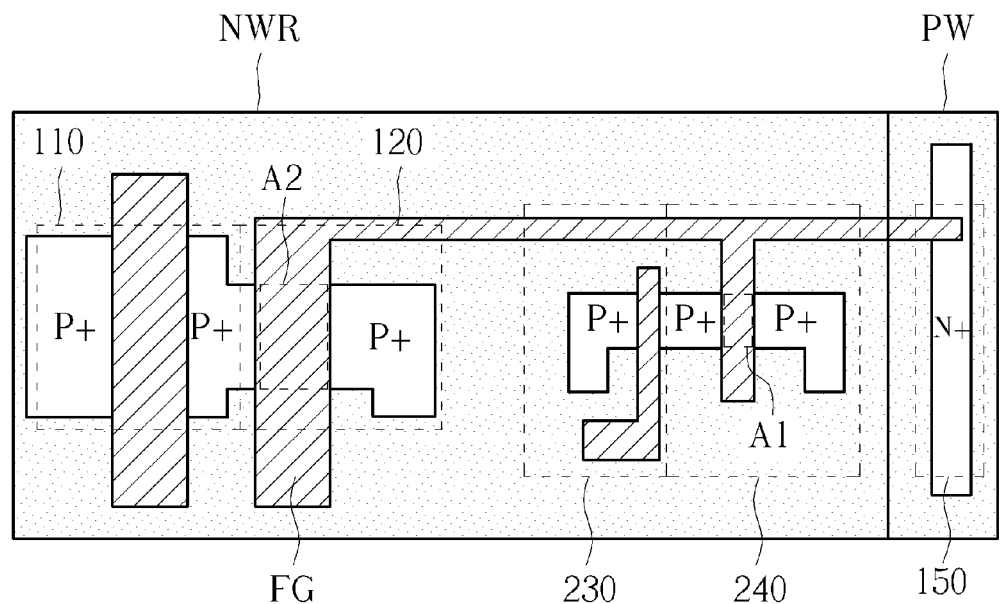
FIG. 8 shows the layout of the memory cell in FIG. 7 according to one embodiments of the present invention.

However, in some embodiments, the read select transistor and the read element can be formed by P-type metal-oxide-semiconductors (PMOS). FIG. 7 shows a memory cell 200 according to another embodiment of the present invention. FIG. 8 shows the layout of the memory cell 200 according to one embodiments of the present invention.

The memory cell 200 has the same structure as the memory cell 100, however, the read select transistor 230 and the read element 240 of the memory cell 200 are formed by PMOS.

In FIG. 7, the program select transistor 110, the program element 120, the read select transistor 230 and the read element 240 are disposed in the same N-well NW while the erase element 150 can be formed by NMOS disposed in a P-well PW.

In this case, since the read select transistor 230 formed by the low voltage process and the erase element 150 are disposed in different wells, the read select transistor 230 can be isolated from the high voltage applied to the erase element 150.

Since the program select transistor 110, the program element 120 and the erase element 150 of the memory cell 200 are the same as the ones in the memory cell 100, the voltages applied in FIGS. 3-5 for the program, erase, and negative erase operations can also be applied to the memory cell 200 for the corresponding operations.

Figure 9:
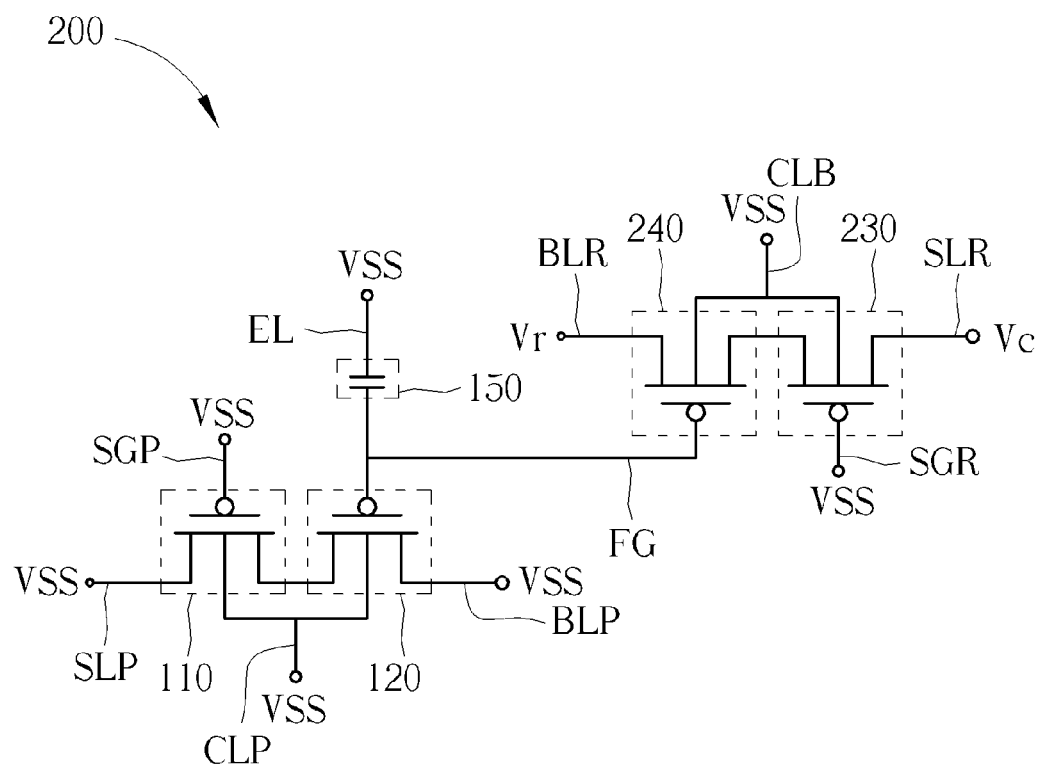
FIG. 9 shows the voltages applied to the control lines of the memory cell in FIG. 7 during the read operation.

However, during the read operation of the memory cell 200, since the read select transistor 230 and the read element 240 are PMOS, the read source line SLR can be at the seventh voltage Vc, the read select line SGR can be at the third voltage VSS, and the read bit line BLR can be at the sixth voltage Vr. FIG. 9 shows the voltages applied to the control lines of the memory cell 200 during the read operation of the memory cell 200.

In this case, the read select transistor 230 can be turned on, and the reading current may be generated according to the status of the common floating gate FG.

Since no high voltages would be applied to the read select transistor 130 of the memory cell 100 and the read select transistor 230 of the memory cell 200, the read select transistor 130 and the read select transistor 230 can both be manufactured by low voltage processes. Therefore, the thickness of the gate oxide of the read select transistors would be smaller than the thicknesses of the gate oxide of other transistors and elements in the memory cell. Consequently, the memory cell can perform the read operation with a low voltage, which not only simplifies the read operation but also increases the reading speed.

Figure 10:
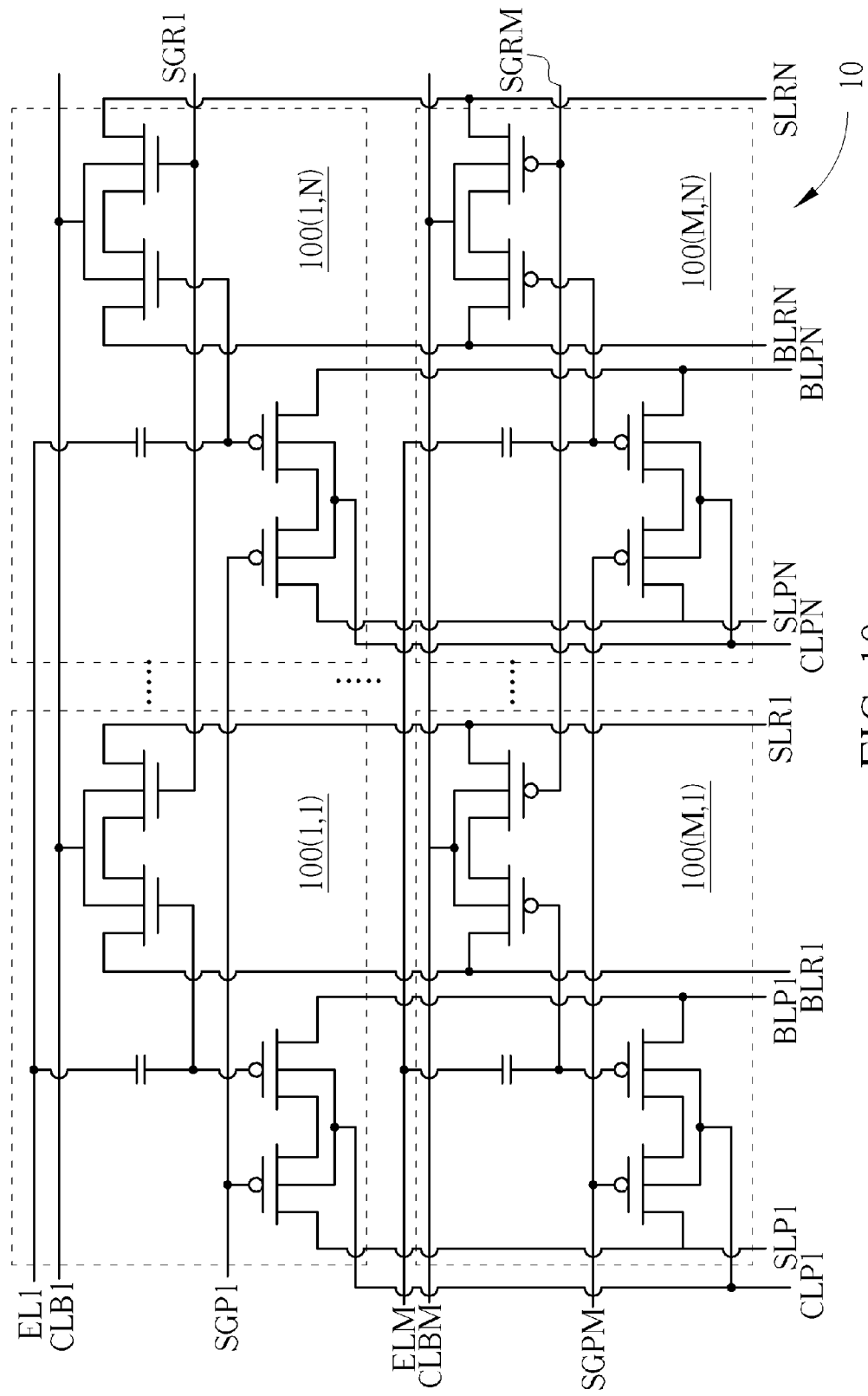
FIG. 10 shows a memory array according to another embodiment of the present invention.

FIG. 10 shows a memory array 10 according to one embodiment of the present invention. The memory array 10 includes N program bit lines BLP1 to BLPN, M program select lines SGP1 to SGPM, N program control lines CLP1 to CLPN, M erase control lines EL1 to ELM, N program source lines SLP1 to SLPN, N read bit lines BLR1 to BLRN, M read select lines SGR1 to SGRM, M bias control lines CLB1 to CLBM, N read source lines SLR1 to SLRN, and M rows of memory cells 100(1,1) to 100(1,N) . . . , and 100(M,1) to 100(M,N). M and N are positive integers.

In FIG. 10, each of the memory cells 100(1,1) to 100(1,N) . . . , and 100(M,1) to 100(M,N) has the same structure as the memory cell 100 as shown in FIG. 1, and each coupled to the corresponding control lines.

In some embodiments, memory cells in the same row are coupled to the same program select line, the same read select line, the same bias control line, and the same erase control line. Also, memory cells in the same column are coupled to the same read bit line, the same read source line, the same program bit line, the same program source line, and the same program control line.

For example, memory cells 100(1,1) and 100(1,N) are disposed in the same row. Therefore, the memory cells 100(1,1) and 100(1,N) are coupled to the same program select line SGP1, the same read select line SGR1, the same bias control line CLB1, and the same erase control line ELI_ Similarly, the memory cells 100(M,1) and 100(M,N) are disposed in the same row. Therefore, the memory cells 100(M,1) and 100(M,N) are coupled to the same program select line SGPM, the same read select line SGRM, the same bias control line CLBM, and the same erase control line ELM.

Also, the memory cells 100(1,1) and 100(M,1) are disposed in the same column. Therefore, the memory cells 100(1,1) and 100(1,N) are coupled to the same read bit line BLR1, the same read source line SLR1, the same program bit line BLP1, the same program source line SLP1, and the same program control line CLP1. Similarly, the memory cells 100(1,N) and 100 (M,N) are disposed in the same column. Therefore, the memory cells 100(1,N) and 100(M, N) are coupled to the same read bit line BLRN, the same read source line SLRN, the same program bit line BLPN, the same program source line SLPN, and the same program control line CLPN.

In another embodiment, all the program control lines of the memory array 10 maybe connected together. Still in another embodiment, all the erase control lines of the memory 10 maybe connected together.

Each of the memory cells 100(1,1) to 100(M,N) of the memory array 10 can perform the program operation, the erase operation, and the read operation as the memory cell 100 as shown in FIGS. 3-5.

In summary, the memory cells and memory arrays provided by the embodiments of the present invention include a read select transistor and a read element for performing the read operation. Since no high voltage is applied to the read select transistor, the read select transistor can be manufactured by a low voltage process. Therefore, the memory cells and the memory arrays are able to perform the read operation with low voltages, which not only simplifies the read operation but also increases the reading speed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
a program select transistor having a first terminal coupled to a program source line, a second terminal, a control terminal coupled to a program select line, and a body terminal coupled to a program control line;
a program element having a first terminal coupled to the second terminal of the program select transistor, a second terminal coupled to a program bit line, and a body terminal coupled to the program control line;
a read select transistor having a first terminal coupled to a read source line, a second terminal, a control terminal coupled to a read select line, and a body terminal coupled to a bias control line;
a read element having a first terminal coupled to the second terminal of the read select transistor, a second terminal coupled to a read bit line, and a body terminal coupled to the bias control line;
a common floating gate coupled to the program element and the read element; and
an erase element having a first terminal coupled to an erase control line, and a second terminal coupled to the common floating gate;
wherein a thickness of a gate oxide of the read select transistor is smaller than a thickness of a gate oxide of the program select transistor.

2. The memory cell of claim 1, wherein:
the program select transistor, the program element, the erase element and the read element are manufactured by a high voltage process; and
the read select transistor is manufactured by a low voltage process.

3. The memory cell of claim 1, wherein:
an area on an active region of the read element overlapping with the common floating gate is smaller than an area on an active of the program element overlapping with the common floating gate.

4. The memory cell of claim 1, wherein the program select transistor and the program element are formed by P-type metal-oxide-semiconductors in a same N-well, and the erase element is formed by an N-type metal-oxide-semiconductor.

5. The memory cell of claim 4, wherein the read select transistor and the read element are formed by N-type metal-oxide-semiconductors.

6. The memory cell of claim 5, wherein:
the read select transistor, the read element, and the erase element are disposed in a same P-well; and
the read select transistor is disposed nonadjacent to the erase element.

7. The memory cell of claim 5, wherein during a program operation of the memory cell:
the program source line is at a first voltage (VPP);
the program select line is in a voltage range between a second voltage (VDD) and a third voltage (VSS);
the program bit line is at the third voltage (VSS);
the program control line is at the first voltage (VPP);
the erase control line is in a voltage range between the second voltage (VDD) and the third voltage (VSS);
the bias control line is at the third voltage (VSS);
the read source line is floating;
the read select line is floating; and
the read bit line is floating;
wherein the first voltage (VPP) is greater than the second voltage (VDD), and the second voltage (VDD) is greater than the third voltage (VSS).

8. The memory cell of claim 5, wherein during an erase operation of the memory cell:
the program source line is at a third voltage (VSS);
the program select line is at the third voltage (VSS);
the program bit line is at the third voltage (VSS);
the program control line is at the third voltage (VSS);
the erase control line is at a fourth voltage (VEE);
the bias control line is at the third voltage (VSS);
the read source line is floating;
the read select line is floating; and
the read bit line is floating;

wherein the fourth voltage (VEE) is greater than the third voltage (VSS).

9. The memory cell of claim 5, wherein during a negative erase operation of the memory cell:
the program source line is at a fifth voltage (VBB);
the program select line is in a voltage range between the fifth voltage (VBB) less a threshold voltage of the program select transistor and a third voltage (VSS);
the program bit line is at the fifth voltage (VBB);
the program control line is at the third voltage (VSS);
the erase control line is at the first voltage (VSS);
the bias control line is at the third voltage (VSS);
the read source line is floating;
the read select line is floating; and
the read bit line is floating;
wherein the third voltage (VSS) is greater than the fifth voltage (VBB).

10. The memory cell of claim 5, wherein during a read operation of the memory cell:
the program source line is at a third voltage (VSS);
the program select line is at the third voltage (VSS);
the program bit line is at the third voltage (VSS);
the program control line is at the third voltage (VSS);
the erase control line is at the third voltage (VSS);
the bias control line is at the third voltage (VSS);
the read source line is at a sixth voltage (Vread);
the read select line is at a seventh voltage (Vcore); and
the read bit line is at the third voltage (VSS);
wherein the seventh voltage is greater than or equal to the sixth voltage, and the sixth voltage is greater than the third voltage.

11. The memory cell of claim 4, wherein the read select transistor and the read element are formed by P-type metal-oxide-semiconductors.

12. The memory cell of claim 11, wherein:
the read select transistor, the read element, the program select transistor, and the program element are disposed in the same N-well; and
the erase element is disposed in a P-well.

13. The memory cell of claim 11, wherein during a program operation of the memory cell:
the program source line is at a first voltage (VPP);
the program select line is in a voltage range between a second voltage (VDD) and a third voltage (VSS);
the program bit line is at the third voltage (VSS);
the program control line is at the first voltage (VPP);
the erase control line is in a voltage range between the second voltage (VDD) and the third voltage (VSS);
the bias control line is at the third voltage (VSS);
the read source line is floating;
the read select line is floating; and
the read bit line is floating;
wherein the first voltage (VPP) is greater than the second voltage (VDD), and the second voltage (VDD) is greater than the third voltage (VSS).

14. The memory cell of claim 11, wherein during an erase operation of the memory cell:
the program source line is at a third voltage (VSS);
the program select line is at the third voltage (VSS);
the program bit line is at the third voltage (VSS);
the program control line is at the third voltage (VSS);
the erase control line is at a fourth voltage (VEE);
the bias control line is at the third voltage (VSS);
the read source line is floating;
the read select line is floating; and
the read bit line is floating;
wherein the fourth voltage (VEE) is greater than the third voltage (VSS).

15. The memory cell of claim 13, wherein during a negative erase operation of the memory cell:
the program source line is at a fifth voltage (VBB);
the program select line is in a voltage range between the fifth voltage (VBB) less a threshold voltage of the program select transistor and a third voltage (VSS);
the program bit line is at the fifth voltage (VBB);
the program control line is at the third voltage (VSS);
the erase control line is at the first voltage (VSS);
the bias control line is at the third voltage (VSS);
the read source line is floating;
the read select line is floating; and
the read bit line is floating;
wherein the third voltage (VSS) is greater than the fifth voltage (VBB).

16. The memory cell of claim 11, wherein during a read operation of the memory cell:
the program source line is at a third voltage (VSS);
the program select line is at the third voltage (VSS);
the program bit line is at the third voltage (VSS);
the program control line is at the third voltage (VSS);
the erase control line is at the third voltage (VSS);
the bias control line is at the third voltage (VSS);
the read source line is at a sixth voltage (Vread);
the read select line is at a third voltage (VSS); and
the read bit line is at the seventh voltage (Vcore);
wherein the seventh voltage is greater than or equal to the sixth voltage, and the sixth voltage is greater than the third voltage.

17. A memory array comprising:
a plurality of program bit lines;
a plurality of program select lines;
a plurality of program control lines;
a plurality of erase control lines;
a plurality of program source lines;
a plurality of read bit lines;
a plurality of read select lines;
a plurality of bias control lines;
a plurality of read source lines; and
a plurality of rows of memory cells, each comprising:
a program select transistor having a first terminal coupled to a corresponding program source line, a second terminal, a control terminal coupled to a corresponding program select line, and a body terminal coupled to a corresponding program control line;
a program element having a first terminal coupled to the second terminal of the program select transistor, a second terminal coupled to a corresponding program bit line, and a body terminal coupled to the program control line;
a read select transistor having a first terminal coupled to a corresponding read source line, a second terminal, a control terminal coupled to a corresponding read select line, and a body terminal coupled to a corresponding bias control line;
a read element having a first terminal coupled to the second terminal of the read select transistor, a second terminal coupled to a corresponding read bit line, and a body terminal coupled to the bias control line;
a common floating gate coupled to the program element and the read element; and
an erase element having a first terminal coupled to a corresponding erase control line, and a second terminal coupled to the common floating gate;

wherein:
a thickness of agate oxide of the read select transistor is smaller than a thickness of a gate oxide of the program select transistor;
memory cells in a same row are coupled to a same program select line, a same read select line, a same bias control line, and a same erase control line; and
memory cells in a same column are coupled to a same read bit line, a same read source line, a same program bit line, a same program source line, and a same program control line.

18. The memory array of claim 17, wherein:
the program select transistor, the program element, the erase element and the read element are manufactured by a high voltage process; and
the read select transistor is manufactured by a low voltage process.

19. The memory array of claim 17, wherein:
the program select transistor and the program element are formed by P-type metal-oxide-semiconductors in a same N-well ; and
the read select transistor, the read element, and the erase element are formed by N-type metal-oxide-semiconductors in a same P-well.

20. The memory array of claim 17, wherein:
the program select transistor, the program element, the read select transistor, and the read element are formed by P-type metal-oxide-semiconductors in a same N-well; and
the erase element is formed by an N-type metal-oxide-semiconductor in a P-well.

* * * * *